(12) United States Patent
Adachi

(10) Patent No.: US 8,105,078 B2
(45) Date of Patent: Jan. 31, 2012

(54) HEAT TREATMENT JIG FOR SEMICONDUCTOR SILICON SUBSTRATES AND METHOD FOR MANUFACTURING THE SAME

(75) Inventor: Naoshi Adachi, Tokyo (JP)

(73) Assignee: Sumco Corporation, Tokyo (JP)

( * ) Notice: Subject to any disclaimer, the term of this patent is extended or adjusted under 35 U.S.C. 154(b) by 981 days.

(21) Appl. No.: 11/702,591

(22) Filed: Feb. 6, 2007

(65) Prior Publication Data

US 2007/0184397 A1 Aug. 9, 2007

(30) Foreign Application Priority Data

Feb. 8, 2006 (JP) ................................. 2006-030348

(51) Int. Cl.
*C23C 16/04* (2006.01)
(52) U.S. Cl. ..................... 432/264; 118/725; 156/345.52
(58) Field of Classification Search ............... 219/444.1; 118/725, 729, 715, 724; 156/345.1, 345.52, 156/345.27, 345.23; 432/5, 253, 258, 262
See application file for complete search history.

(56) References Cited

U.S. PATENT DOCUMENTS

| | | | | |
|---|---|---|---|---|
| 5,389,582 A | * | 2/1995 | Loxley et al. ...................... 501/4 |
| 5,534,300 A | * | 7/1996 | Solntsev et al. ............. 427/376.2 |
| 5,766,291 A | | 6/1998 | Sano et al. |
| 5,876,473 A | * | 3/1999 | Inaki et al. ...................... 65/32.1 |
| 5,976,247 A | * | 11/1999 | Hansen et al. ................. 117/200 |
| 6,027,569 A | * | 2/2000 | Brown ........................... 118/725 |
| 6,197,373 B1 | * | 3/2001 | Brown ........................ 427/248.1 |
| 6,534,751 B2 | * | 3/2003 | Uchiyama et al. .......... 219/444.1 |
| 6,875,515 B2 | * | 4/2005 | McNulty et al. .............. 428/432 |
| 7,166,165 B2 | * | 1/2007 | Halpin .......................... 118/715 |
| 7,332,228 B2 | * | 2/2008 | Fukaya et al. ................. 428/469 |
| 7,501,370 B2 | * | 3/2009 | Narendar et al. ............... 501/88 |
| 2002/0011211 A1 | * | 1/2002 | Halpin .......................... 118/715 |
| 2007/0119377 A1 | * | 5/2007 | Halpin .......................... 118/724 |
| 2008/0075949 A1 | * | 3/2008 | Kirst et al. .................... 428/332 |

FOREIGN PATENT DOCUMENTS

| | | |
|---|---|---|
| JP | 09-199438 | 7/1997 |
| JP | 10-242067 | 9/1998 |
| JP | 2003-100648 | 4/2003 |
| JP | 2003-197722 | 7/2003 |
| TW | 438731 | 6/2001 |
| TW | 200400924 | 1/2004 |
| TW | 1242248 | 10/2005 |

* cited by examiner

*Primary Examiner* — Gregory A Wilson
(74) *Attorney, Agent, or Firm* — Clark & Brody

(57) ABSTRACT

A heat treatment jig for semiconductor silicon substrates is configured such that a cristobalitized oxide film is formed in a region where the cristobalitized oxide film is in contact with a silicon substrate backside. When said heat treatment jig is used, generation of a slip can be prevented during heat treatment. In the case where the heat treatment jig is used in combination with a shielding plate, particles are further prevented from adhering to the silicon substrate surface to maintain quality characteristics of the semiconductor silicon substrate at a higher level, and device production yield can largely be improved. The heat treatment jig can easily be manufactured by introducing a cristobalitization promoting agent to a surface or in the vicinity of a surface of the heat treatment jig, performing the heat treatment at temperatures in the range of 1000 to 1380° C., and repeating the introduction of the cristobalitization promoting agent and the heat treatment.

20 Claims, 8 Drawing Sheets

HEAT TREATMENT JIG FOR SEMICONDUCTOR SILICON SUBSTRATES AND METHOD FOR MANUFACTURING THE SAME

BACKGROUND OF THE INVENTION

1. Field of the Invention

The present invention relates to a heat treatment jig used for a heat treatment boat in a vertical heat treatment furnace and a method for manufacturing the same, and more particularly to the heat treatment jig for semiconductor silicon substrates which can decrease the number of slips generated as lattice defects when heat treatment is performed to a semiconductor material such as a semiconductor silicon substrate at high temperatures, and the method for manufacturing the same.

2. Description of the Related Art

The semiconductor silicon substrate processed in an LSI device fabrication process is produced by repeating high-temperature heat treatment in steps such as oxidation, diffusion, and film deposition. In the heat treatment of the semiconductor silicon substrate, a compact installation space is realized in the vertical heat treatment furnace and the vertical heat treatment furnace is suitable for the heat treatment of plenty of large-diameter semiconductor silicon substrates. Therefore, the vertical heat treatment furnace is adopted as the apparatus to be used in various kinds of heat treatment of the semiconductor silicon substrate.

FIG. 1 shows a configuration example of the conventional semiconductor silicon substrate heat treatment boat used in the vertical heat treatment furnace. A heat treatment boat 1 includes at least three props 3, an upper end plate 5, and a lower end plate 6. The props 3 are fixed at upper and lower positions by the upper end plate 5 and the lower end plate 6. An opening 2 is provided in the heat treatment boat 1. A row of substrate support portions 4 is arranged in a multi-tier manner in the props 3. After the semiconductor silicon substrates are placed on the substrate support portions 4 from the side of the opening 2, the heat treatment boat 1 is inserted in to the vertical heat treatment furnace to perform a predetermined heat treatment.

In the case where the semiconductor silicon substrate is inserted into the vertical heat treatment furnace to perform the high-temperature heat treatment at temperatures of not less than 1100° C., when an uneven temperature distribution is generated in a surface of the semiconductor silicon substrate, a resultant thermal stress is generated in the semiconductor silicon substrate. Sometimes a stress (hereinafter simply referred to as "own-weight stress") caused by a weight of the silicon substrate is generated depending on a method of supporting the semiconductor silicon substrate. Particularly, in the case where the heat treatment is performed to the semiconductor silicon substrate having a diameter of 300 mm using the heat treatment boat of FIG. 1, the own-weight stress has a large influence on the silicon substrate in the conventional method of supporting only an outer peripheral portion of the silicon substrate. As a result, it becomes difficult to use the heat-treated silicon substrate.

The thermal stress or the own-weight stress generates a crystal defect called a slip in the semiconductor silicon substrate during the heat treatment. Because the slip causes an increase in leak current of a LSI device or degradation of semiconductor silicon substrate flatness, conventionally various proposals are made to suppress the thermal stress or the own-weight stress.

For example, Japanese Patent Application Publication Nos. 10-242067 and 2003-100648 disclose a disc-structured heat treatment jig which supports a whole backside of the silicon substrate with a flat plate. The use of the heat treatment jig disclosed in Japanese Patent Application Publication Nos. 10-242067 and 2003-100648 can decrease a deflection displacement. However, a local temperature difference is easily generated in a region where silicon substrate to be heat-treated comes into plane contact with the heat treatment jig, and sometimes the slip is generated due to the thermal stress.

In order to solve the problem of the disc-structured heat treatment jig, there is proposed a heat treatment jig having a ring structure. Typically, Japanese Patent Application Publication No. 09-199438 discloses a heat treatment jig including a ring tray for receiving the outer peripheral portion of the silicon substrate backside. However, in the heat treatment jig including the ring tray, a central portion of the silicon substrate is bent by the own-weight, which causes the silicon substrate to come into contact with an inner peripheral end face of the ring tray. At this point, a surface flaw is generated in the silicon substrate, and the slip is generated while initiating from the surface flaw.

Japanese Patent Application Publication No. 2003-197722 discloses a ring shape (including horseshoe shape) heat treatment jig, wherein flatness and surface roughness are specified in the silicon substrate receiving surface where the silicon substrate and the heat treatment jig are in contact with each other, plural through-holes are made, being arranged in a concentric circle, in the silicon substrate receiving surface, and the total area of the through-holes is specified. In Japanese Patent Application Publication No. 2003-197722, preferably the surface roughness Ra ranges from 0.1 to 0.7 μm and the flatness is not more than 50 μm.

However, in the case of the heat treatment jig which is targeted for semiconductor silicon substrate having the diameter of 300 mm, when the flatness of not more than 50 μm is secured in the whole region where the silicon substrate is received, high-accuracy machining is required. Therefore, not only the production cost is increased, but also the realistic production conditions cannot be achieved from the viewpoint of machining accuracy.

SUMMARY OF THE INVENTION

As described above, the thermal stress or the own-weight stress generated in performing the high-temperature heat treatment to the semiconductor silicon substrate causes the slip in the silicon substrate. Therefore, in order to secure quality characteristics of the semiconductor silicon substrate, various countermeasures are proposed with respect to the heat treatment jig which can effectively prevent the generation of the thermal stress or the own-weight stress. However, in the conventional heat treatment jig, the generation of the slip is not sufficiently prevented.

In view of the foregoing, it is an object of the present invention to provide a heat treatment jig which can decrease the number of crystal defects called slips generated when the heat treatment is performed to the semiconductor silicon substrate, and the method for manufacturing the same.

In order to solve the problem, the inventor performs detail study about the silicon substrate in which the slip is generated. As a result of the study, it is found that the majority of the slip generation is attributed to the following circumstances.

Even if the conventional silicon ring-shape jig in which the flatness is properly specified is used as the heat treatment jig, the slips are generated for most silicon substrates subjected to the high-temperature heat treatment in an oxidizing atmosphere like the heat treatment performed in a SIMOX producing process. Accordingly, when the slip generation regions (backside of the silicon substrate) are observed, in all of the slip generation regions, the silicon substrate and the silicon ring-structured jig are locally bonded with each other during the heat treatment, and thereby the stress exerted to the substrate exceeds a critical stress in the region to lead to the slip generation.

On the other hand, the slip is not generated in some of the heat treatment jigs including the same ring structure as that of the heat treatment jig in which the slip is generated. As a result of various studies on the heat treatment jig in which the slip is not generated, it is found that an oxide film grown in a surface of the heat treatment jig has not an amorphous structure but cristobalitization (re-crystallization), and it is also found that many cracks are generated in the cristobalitized oxide film, similarly to the case of quartz in which a so-called devitrification phenomenon is generated.

Accordingly, the incorporation of alkali metal or alkali earth metal is usually limited to prevent the devitrification in a quartz jig, but contrarily, using the alkali metal or the alkali earth metal makes it possible to substantially decrease the slip generation by intentionally growing cristobalite in the surface of the heat treatment jig for semiconductor silicon substrates.

In forming the cristobalitized oxide film in the surface of the heat treatment jig, the inventor finds out that introduction of a cristobalitization promoting agent to the surface or in the vicinity of the surface of the heat treatment jig and the repetitive heat treatment in a predetermined temperature range are effective, and the inventor also finds out that impurities (alkali metal, alkali earth metal and the like) mixed in the chemical agent or in the chemical agent cleaning cell, used in cleaning the heat treatment jig, or alternatively contaminant impurities inside the heat treatment furnace can be utilized as the cristobalitization promoting agent in stead of introducing said cristobalitization promoting agent.

Namely, either the condition in which cracks are generated on the surface of the heat treatment jig to contact with and support the back side of wafers, or the condition in which, when cracks are absent and even the bonding with the back side of wafers occurs, the bonding is controlled to be easily dismissed, can be applicable in order to suppress the slip generation. The described example as above delineates the condition in which cracks are generated on the jig surface by cristobalization, but, for example, it is also feasible that an oxide film is grown on the surface of heat treatment jig and a nitrided film with different thermal expansion coefficient is further deposited thereon to thereby induce cracking on the nitrided film surface. Alternatively, it can be the method such that the particles are coated on the surface of heat treatment jig to be subsequently fired and deposited thereon by heat treatment.

Furthermore, the inventor devises a heat treatment jig having the configuration in which the particles adhering to the semiconductor silicon substrate surface can be decreased during the heat treatment.

That is, the slip generation can be prevented in the semiconductor silicon substrate during the heat treatment by forming the cristobalitized oxide film in the surface of the heat treatment jig, but the many cracks are generated in the oxide film by the cristobalitization, whereby the particles are liable to be generated. In this regard, in the case where the heat treatment jig is mounted on the heat treatment boat of the vertical heat treatment furnace, the particles tend to move downward and adhere to the surfaces of silicon substrates placed at the lower part of the heat treatment jig, thereby decreasing the device quality characteristics and production yield. However, by virtue of concurrently installing a shielding plate in the heat treatment boat, the particle adhesion to the silicon substrate surface can be prevented while the slip generation is suppressed, the shielding plate having the cristobalitized oxide film in the surface thereof and being larger in diameter than the heat treatment jig.

The present invention is made based on the above technological conception and findings, and the present invention mainly pertains to a heat treatment jig for semiconductor silicon substrates described in (1) and (2), and a method for manufacturing a heat treatment jig described in (3) as below.

(1) A heat treatment jig for semiconductor silicon substrates which is mounted on a heat treatment boat in a vertical heat treatment furnace to support a semiconductor silicon substrate while contacting therewith, wherein a cristobalitized oxide film is formed in a region thereof functioning to support said semiconductor silicon substrate while contacting therewith.

In the heat treatment jig for semiconductor silicon substrates of (1), preferably the cristobalitized oxide film is obtained by performing heat treatment after a cristobalitization promoting agent is introduced to the heat treatment jig or to a surface or in the vicinity of a surface of the heat treatment jig which is subjected to an oxidation treatment beforehand.

Preferably the cristobalitization promoting agent is alkali metal, alkali earth metal, aluminum, or transition metal.

Preferably a concentration of the cristobalitization promoting agent introduced to the surface or in the vicinity of the surface of the heat treatment jig is not less than $1 \times 10^{10}$ atoms/$cm^2$ in area equivalent which is conversion per unit area. With reference to the measuring method, it can be applied such that: after the silicon substrate is dipped in an aqueous solution to which the cristobalitization promoting agent is added, the silicon substrate is sufficiently dried: and an unforced oxide film in the silicon substrate surface is removed with hydrofluoric acid: then, a concentration of the cristobalitization promoting agent in the recovered hydrofluoric acid is measured by an atomic absorption method, and converted by per unit area to the surface concentration.

(2) A heat treatment jig of the above (1), further comprising a shielding plate which prevents particles from adhering to a semiconductor silicon substrate, the particles being generated due to a cristobalitized oxide film, the shielding plate having a diameter larger than that of the heat treatment jig.

(3) A method of manufacturing a heat treatment jig for semiconductor silicon substrates of (1), comprising the steps of: introducing a cristobalitization promoting agent to a surface or in the vicinity of a surface of the heat treatment jig; performing heat treatment at temperatures in the range of 1000 to 1380° C.; and, repeating the introduction of the cristobalitization promoting agent and the heat treatment.

Impurities mixed in a heat treatment jig cleaning chemical agent can be utilized as the cristobalitization promoting agent to be used in the above (3). In this case, part of the oxide film existing in the surface of the heat treatment jig is left over when the heat treatment jig is cleaned using hydrofluoric acid as the heat treatment jig cleaning chemical agent.

According to the heat treatment jig for semiconductor silicon substrates of the present invention, the cristobalitized oxide film is formed in the region where contacting with the backside of and supporting the semiconductor silicon substrate. Therefore, when the heat treatment jig is used, the generation of the slip can be prevented during the heat treatment. In the case where the heat treatment jig is used in combination with the shielding plate, the particles are further prevented from adhering to the silicon substrate surface to maintain quality characteristics of the semiconductor silicon substrate at a higher level, and device production yield can substantially be improved. The heat treatment jig can easily be manufactured by the method for manufacturing the jig of the present invention.

DETAILED DESCRIPTION OF THE PREFERRED EMBODIMENTS

A heat treatment jig for semiconductor silicon substrates of the present invention which is mounted on a heat treatment boat in a vertical heat treatment furnace to support a semiconductor silicon substrate while contacting therewith, is characterized in that a cristobalitized oxide film is formed in a region thereof functioning to support semiconductor silicon substrates while contacting therewith. In the following description, sometimes the heat treatment jig having the above feature is referred to as "cristobalitized heat treatment jig" where needed.

Figure 1:
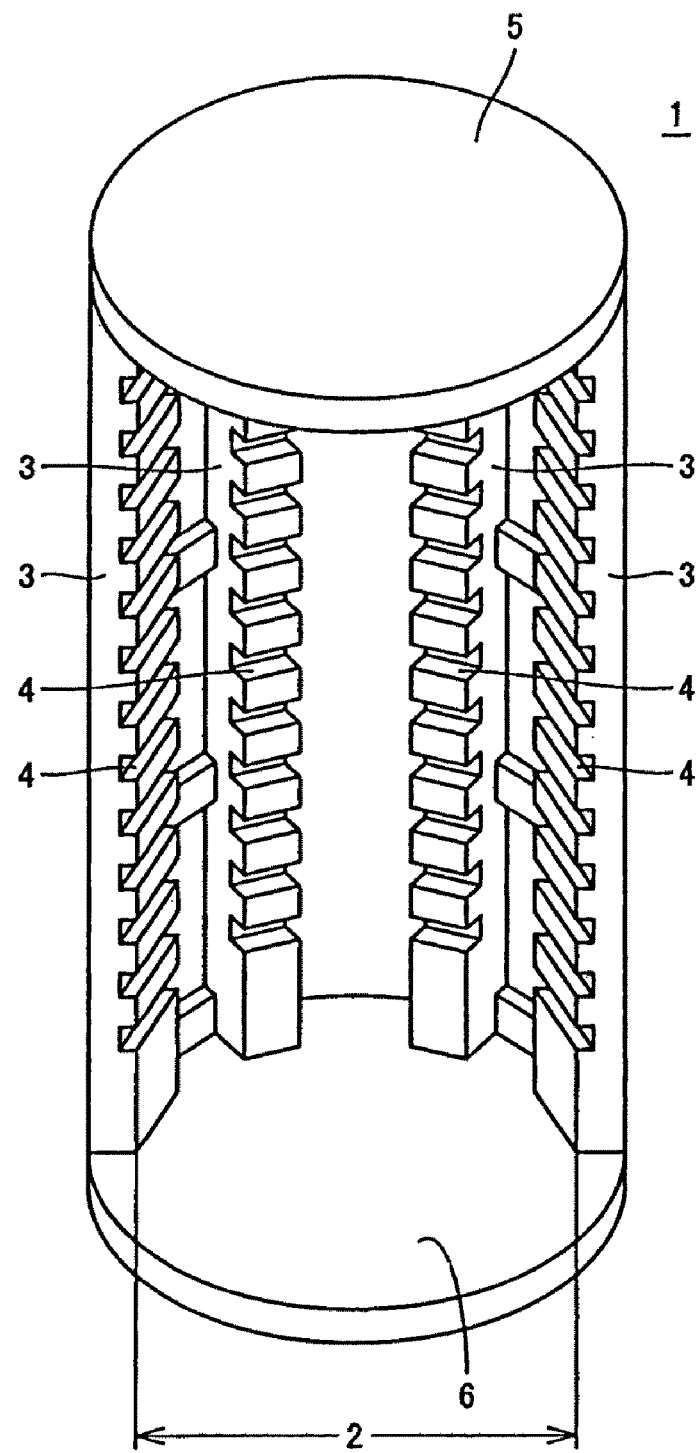
FIG. 1 shows a configuration example of a conventional heat treatment boat for semiconductor silicon substrates used in a vertical heat treatment furnace.
Figure 2:
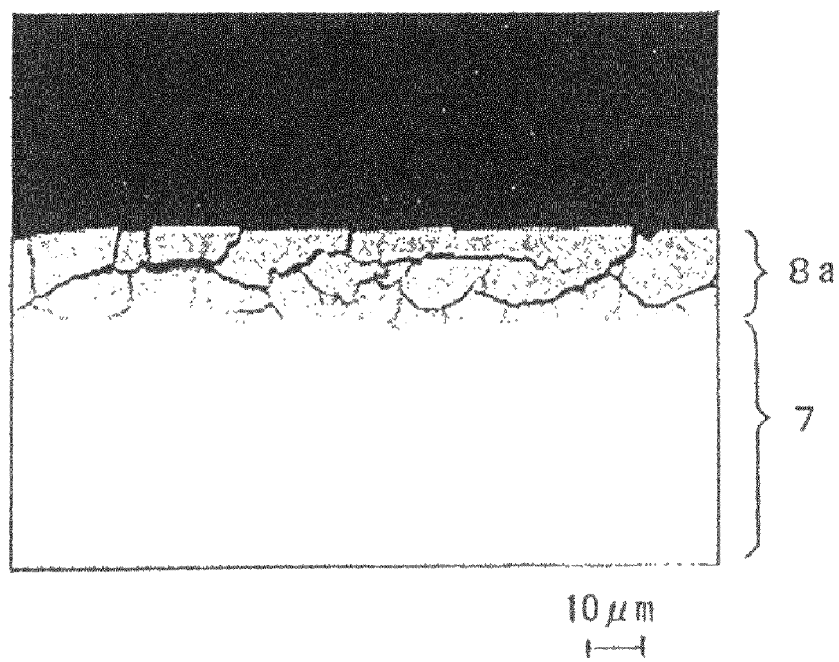
FIG. 2 is a microphotograph illustrating a cross-section of an oxide film formed in a surface of a heat treatment jig according to the present invention.
Figure 3:
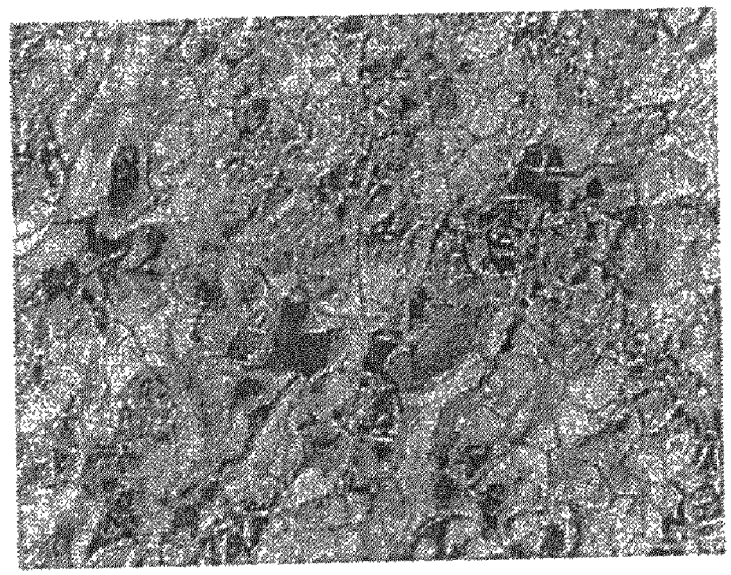
FIG. 3 is a SEM photograph illustrating a surface of the oxide film formed in the surface of the heat treatment jig according to the present invention.
Figure 4:
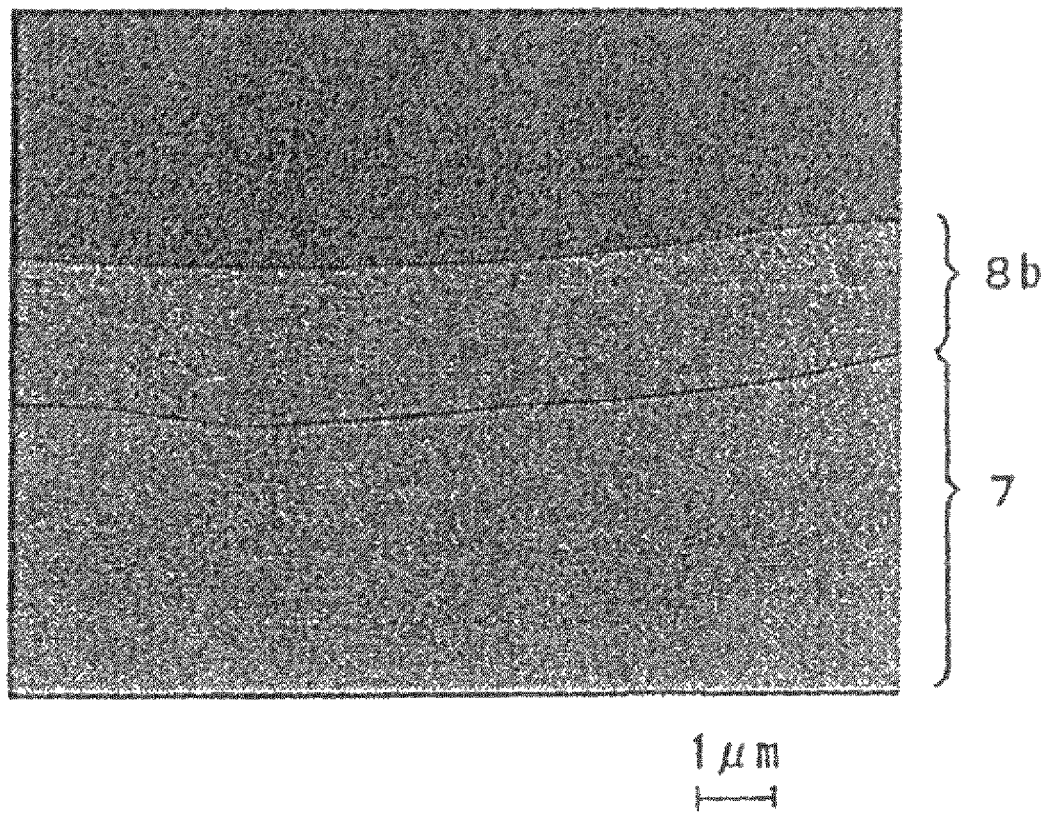
FIG. 4 is a microphotograph illustrating a cross-section of the oxide film formed in the surface of the conventional heat treatment jig.

FIG. 2 is a microphotograph illustrating a section of an oxide film formed in a surface of the heat treatment jig according to the present invention, and FIG. 3 is a SEM photograph illustrating the surface of the cristobalitized oxide film. FIG. 4 is a microphotograph illustrating a cross-section of the oxide film formed in the surface of the conventional heat treatment jig.

As shown in FIG. 2, an oxide film 8a formed in a surface of a silicon material 7 constituting the heat treatment jig of the present invention is cristobalitized to generate many cracks. The SEM photograph of FIG. 3 also shows that the many cracks are generated in the surface of the oxide film.

The use of the heat treatment jig wherein the oxide film is formed in the surface thereof allows the generation of the slip to be prevented even in the heat treatment in the high-temperature oxidizing atmosphere. This is considered to be attributed to the following fact: The oxide film having the many cristobalitized cracks formed in the surface of the jig is easily peeled off in the form of fragments even if the heat treatment jig bonds locally with the backside of the silicon substrate during the heat treatment, and the thermal stress is easily released even if the thermal stress is exerted to the silicon substrate: Therefore, there is not exerted such a stress that exceeds a critical stress, resulting in the generation of the slip.

That is, it is thought that the cristobalitized oxide film functions effectively to prevent the bonding between the heat treatment jig and the silicon substrate.

On the other hand, as shown in FIG. 4, in an ordinary oxide film 8b formed in the surface of the conventional heat treatment jig is neither cristobalitized nor is found the crack. Therefore, once the heat treatment jig bonds with the backside of the silicon substrate during the heat treatment, the silicon substrate is constrained at that time, and the stress exerted to the substrate has nowhere to escape, which results in the generation of the slip.

In the heat treatment jig of the present invention, the bond preventing function is sufficiently performed when the cristobalitized oxide film shown in FIGS. 2 and 3 is formed in the region functioning to support the substrates while contacting therewith when the semiconductor silicon substrate is in place. The cristobalitized oxide film may be formed in a wider region within and beyond the contacting region simply because of the equipment/installation restriction in producing the jig, and the entire surface of the heat treatment jig may be covered with the cristobalitized oxide film.

There is no particular limitation about characteristics, a forming method, thermal history of the cristobalitized oxide film. Any cristobalitized oxide film may be used as the cristobalitized oxide film of the present invention as long as the cracks are generated, which is an intrinsic characteristic of the cristobalitized oxide film, and is easily peeled off in the cristobalitized oxide film.

Any shape such as a ring structure type or a disc structure type which is conventionally used or proposed may be employed as the shape of the heat treatment jig of the present invention. The material grade for the cristobalitized oxide film preferably include quartz, sapphire, and silicon carbide, in which many cracks are generated by the devitrification phenomenon in the oxide film to be formed by the oxidation treatment at high temperatures.

In the heat treatment jig of the present invention, preferably the oxide film having many cristobalitized cracks is the oxide film which is obtained by performing the heat treatment after the cristobalitization promoting agent is introduced to the surface or in the vicinity of the surface of the heat treatment jig. As shown in FIGS. 2 and 3, the oxide film in which many cracks are generated can be formed in the surface of the heat treatment jig with a relatively simple operation by an effect of the cristobalitization promoting agent.

As used herein, "in the vicinity of a surface" shall mean a penetration range of the cristobalitization promoting agent in the case where sometimes part of the cristobalitization promoting agent put on the jig surface penetrates slightly inward from the surface by a thermal diffusion mechanism in a process of the introducing treatment.

In introducing the cristobalitization promoting agent, followed by the heat treatment, an oxidation treatment may be performed to the surface of the heat treatment jig beforehand. In this case, by the effect of the cristobalitization promoting agent introduced to the surface or in the vicinity of the surface of the pre-formed oxide film, cristobalitization takes place therein to generate the many cracks, or, an oxide film having the many cracks is newly formed in the surface of the pre-formed oxide film at the same time.

Said heat treatment is performed to obtain the cristobalitized oxide film, and the heat treatment is not limited to the specific conditions. Depending on the types of cristobalitization promoting agent or the concentration (concentration in area equivalent) thereof, preferably the heat treatment is performed at temperatures in the range of 1100 to 1350° C., for a duration time of 10 to 50 hours in the oxidizing atmosphere, for example, when calcium is used as the cristobalitization promoting agent.

There is no particular limitation in a method for introducing the cristobalitization promoting agent to the heat treatment jig or the surface or near surface of the heat treatment jig in which the oxidation treatment is performed beforehand. For example, the cristobalitization promoting agent can easily be introduced to the heat treatment jig or the surface or in the vicinity of the surface of the heat treatment jig in which the oxidation treatment is performed beforehand by adopting a method of dipping the heat treatment jig in a sodium aqueous solution or a method of falling the sodium aqueous solution in drops on the surface (i.e., the surface to be cristobalitized) of the heat treatment jig.

There is no particular limitation for the cristobalitization promoting agent. Examples of the cristobalitization promoting agent preferably include alkali metals such as sodium and potassium, alkali earth metals such as calcium, barium, and magnesium, aluminum, and transition metals such as tungsten, zirconium, and molybdenum, these elements are well known as components which cause the quartz devitrification. As shown in the after-mentioned examples, this is because the cristobalitization promotion effect of these is remarkably performed and silicon substrate is free from the contamination by them.

In the cristobalitization promoting agent introduced to the surface or in the vicinity of the surface of the pre-formed oxide film, preferably the concentration is not less than $1 \times 10^{10}$ atoms/cm$^2$ in area equivalent, namely, the number of metallic atoms such as sodium and potassium existing in the surface (1 cm$^2$) of the heat treatment jig is not less than $10^{10}$. When the concentration is not less than $1 \times 10^{10}$ atoms/cm$^2$, the cristobalitization is promoted in the oxide film to be formed, so that the oxide film in which the many cracks are generated can be formed in the surface of the heat treatment jig.

The heat treatment jig of the present invention can be formed by the heat treatment jig in which the cristobalitized oxide film is formed in the region functioning to support the silicon substrate while contacting therewith, i.e., the cristobalitized heat treatment jig and the shielding plate having the diameter larger than that of the cristobalitized heat treatment jig.

The shielding plate is mounted on the heat treatment boat in order to suppress the adhesion of the particles generated due to the cristobalitized oxide film to the semiconductor silicon substrate. In the following description, sometimes the heat treatment jig including the shielding plate is referred to as "heat treatment jig with a shielding plate" where needed.

The reason why the heat treatment jig with a shielding plate is used is that, during the heat treatment, the particle needs to be prevented from adhering to the silicon substrate surface, while the generation of the slip is prevented in the semiconductor silicon substrate.

Therefore, the material in which the particles are hardly generated by the contact with another object can be used as the shielding plate so as to suppress the adhesion of the particles generated due to the cristobalitized oxide film to the semiconductor silicon substrate. For example, it should be convenient that the same material as the cristobalitized heat treatment jig, and that has no cristobalitized oxide film on its surface may be used.

Figure 5A:
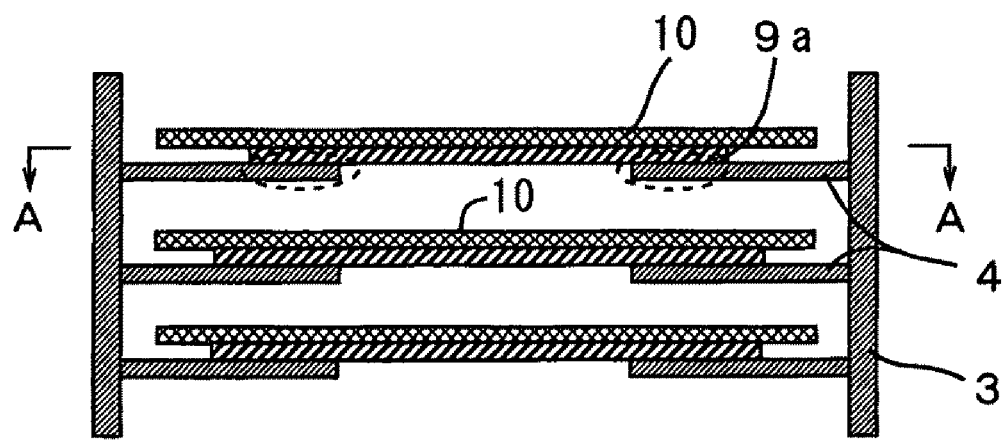
FIG. 5A is a longitudinal cross-sectional view of part of the heat treatment boat, schematically showing how a cristobalitized heat treatment jig of a disc structure type is mounted.
Figure 5B:
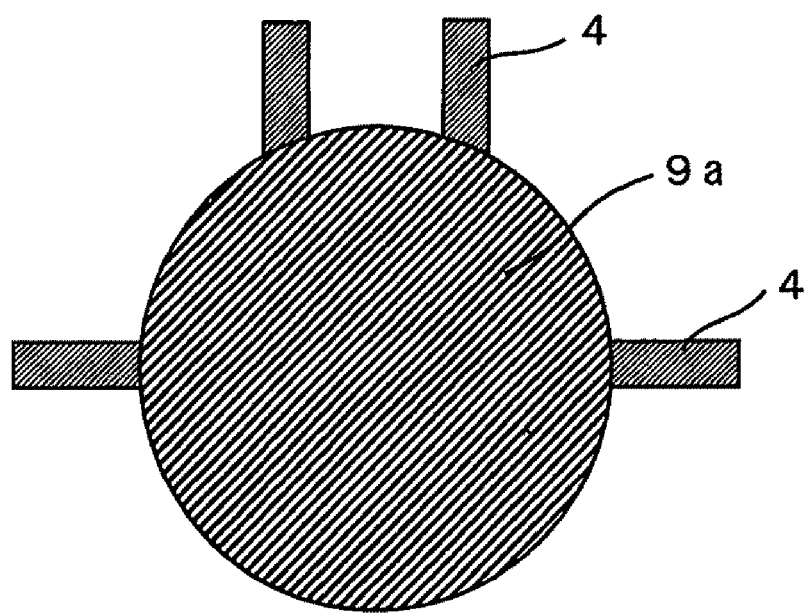
FIG. 5B is a cross-sectional view seen in the direction of arrow A-A of FIG. 5A.

FIG. 5A is a longitudinal cross-sectional view of part of the heat treatment boat, schematically showing how a cristobalitized heat treatment jig of a disc structure type is set, and FIG. 5B is a cross-sectional view seen in the direction of arrow A-A of FIG. 5A. As shown in FIGS. 5A and 5B, cristobalitized heat treatment jigs 9a are directly mounted on the substrate support portions 4 arranged in a multi-tier manner in the props 3.

In this case, because many cracks are generated in the oxide film formed in the surface of the cristobalitized heat treatment jig 9a, the particles are easily generated (region surrounded by a broken line) by the contact between the substrate support portion 4 and the heat treatment jig 9a, and the particles easily move downward and adhere to a surface of the silicon substrate 10 inserted into a boat groove (between the adjacent upper and lower substrate support portions) immediately below the heat treatment jig 9a.

Figure 6A:
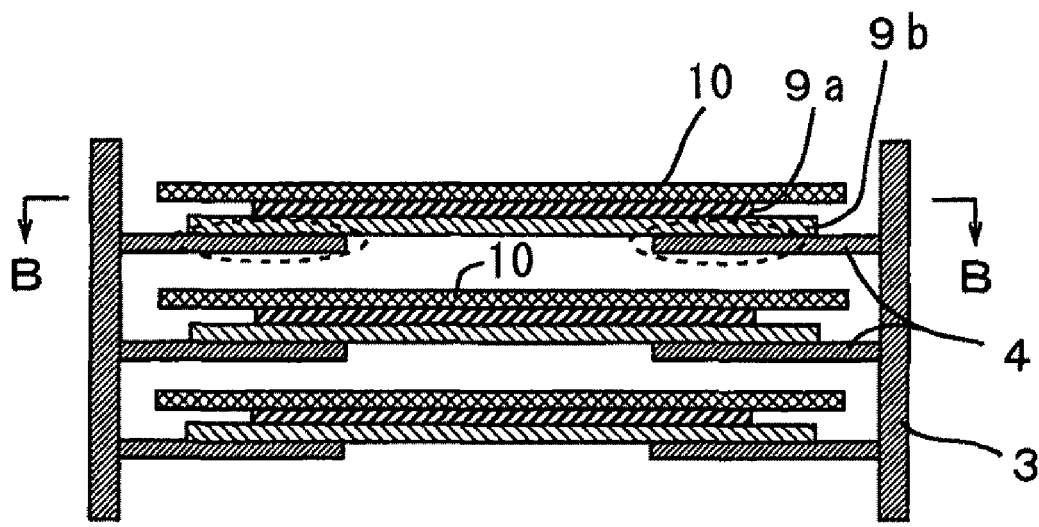
FIG. 6A is a longitudinal cross-sectional view of part of the heat treatment boat, schematically showing how a heat treatment jig with a shielding plate comprising the cristobalitized heat treatment jig of the disc structure type and the shielding plate of the disc structure type is mounted.
Figure 6B:
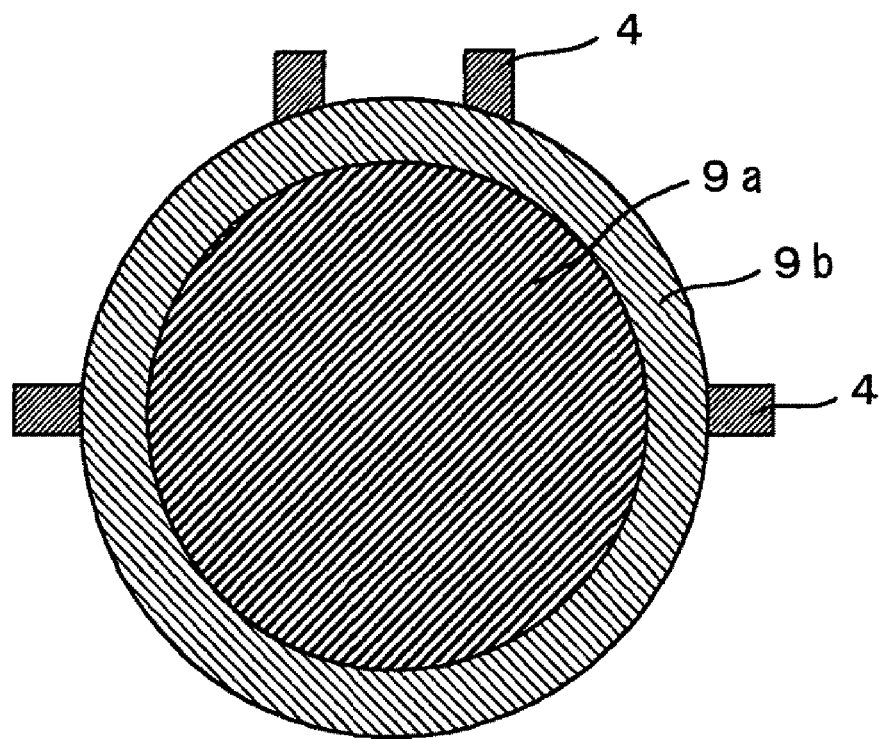
FIG. 6B is a cross-sectional view seen in the direction of arrow B-B of FIG. 6A.

FIG. 6A is a longitudinal cross-sectional view of part of the heat treatment boat, schematically showing how a heat treatment jig with a shielding plate comprising the cristobalitized heat treatment jig of the disc structure type and the shielding plate of the disc structure type is set, and FIG. 6B is a cross-sectional view seen in the direction of arrow B-B of FIG. 6A.

As shown in FIGS. 6A and 6B, a shielding plate 9b of the disc structure type whose diameter is larger than that of the cristobalitized heat treatment jig 9a is placed in the substrate support portion 4, and the cristobalitized heat treatment jig 9a of the disc structure type is set on the shielding plate 9b. In this case, even if the particles are generated by the contact between the cristobalitized heat treatment jig 9a and the shielding plate 9b, the particles cannot move downward on and adhere to the silicon substrate surface 10 placed on the substrate support portion 4 immediately below the shielding plate 9b because the shielding plate 9b has the diameter larger than that of the cristobalitized heat treatment jig 9a.

Although the particles are generated (region surrounded by the broken line) by the contact between the substrate support portion 4 and the shielding plate 9b, the number of generated particles is significantly decreased compared with the case (FIGS. 5A and 5B) where the cristobalitized heat treatment jig 9a is directly mounted on the substrate support portion 4 without using the shielding plate 9b. This is because the many cracks are generated in the oxide film in the surface of the heat treatment jig 9a by the cristobalitization to easily generate the particles in the oxide film, while the cracks are not generated in the surface of the shielding plate 9b.

Figure 7A:
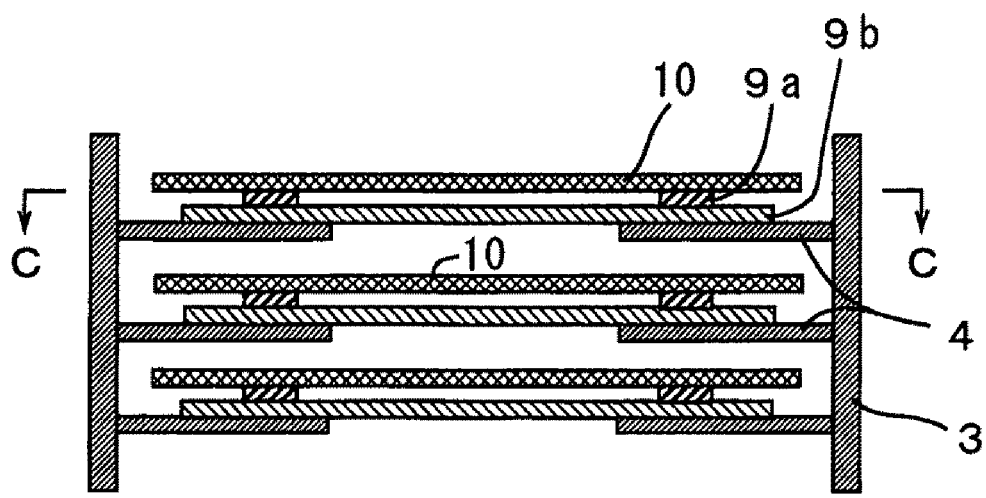
FIG. 7A is a longitudinal cross-sectional view of part of the heat treatment boat, schematically showing how a heat treatment jig with a shielding plate comprising a cristobalitized heat treatment jig of a ring structure type and the shielding plate of a disc structure type is set.
Figure 7B:
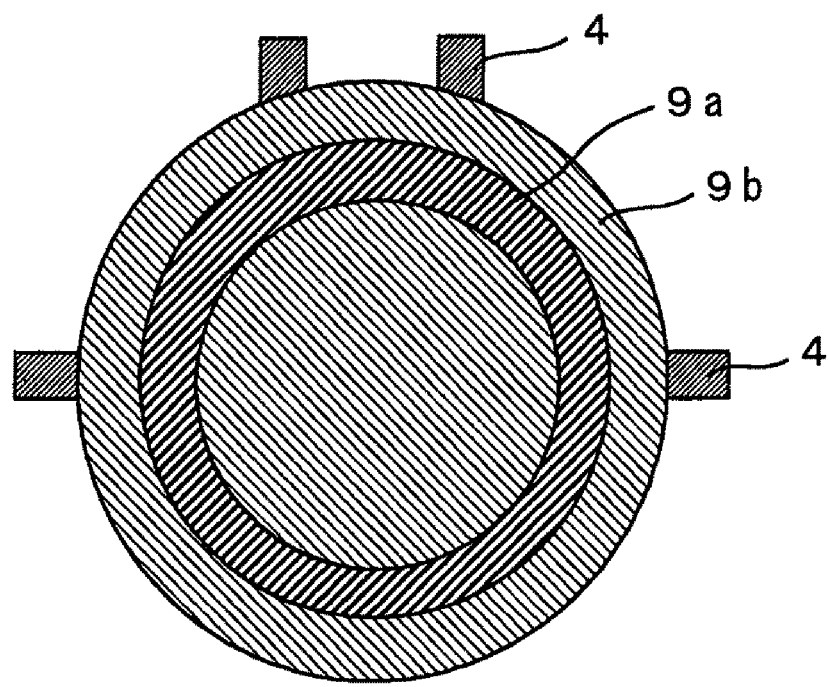
FIG. 7B is a cross-sectional view seen in the direction of arrow C-C of FIG. 7A.

FIG. 7A is a longitudinal cross-sectional view part of the heat treatment boat, schematically showing how a heat treatment jig with a shielding plate comprising a cristobalitized heat treatment jig of a ring structure type and the shielding plate of the disc structure type is set, and FIG. 7B is a cross-sectional view seen in the direction of arrow C-C of FIG. 7A. As shown in FIGS. 7A and 7B, the shielding plate 9b of the disc structure type whose diameter is larger than an outer diameter of the cristobalitized heat treatment jig 9a is placed in the substrate support portion 4, and the cristobalitized heat treatment jig 9a of the ring structure type is mounted on the shielding plate 9b.

In this case, the particles generated by the contact between the cristobalitized heat treatment jig 9a and the shielding plate 9b are kept on the shielding plate 9b, so that the particles do not move downward and. adhere to the silicon substrate surface 10 inserted into the boat groove immediately below the shielding plate 9b.

Figure 8:
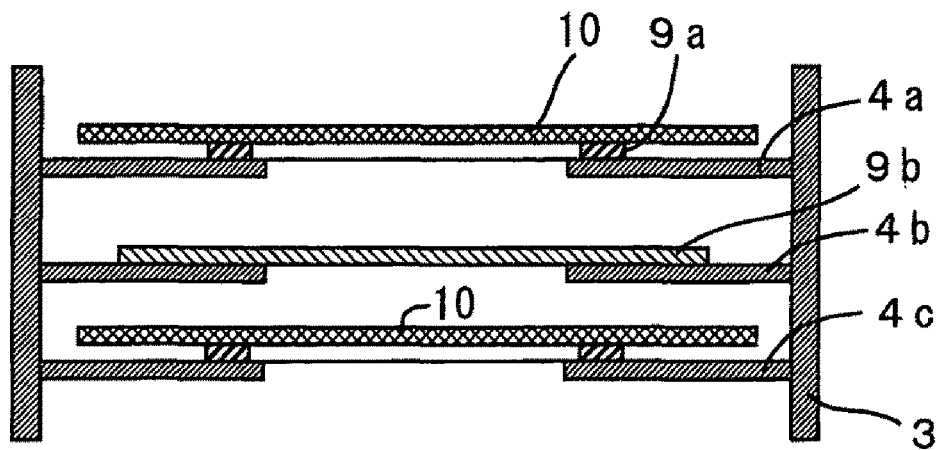
FIG. 8 is a longitudinal cross-sectional view of part of the heat treatment boat, schematically showing how a heat treatment jig with a shielding plate is set.

FIG. 8 is a longitudinal cross-sectional view part of the heat treatment boat, schematically showing how the heat treatment jig with the shielding plate is set, and FIG. 8 shows the case where the heat treatment jigs 9a and the shielding plates 9b are alternately mounted on the substrate support portions.

In this case, the particles are easily generated because the cristobalitized heat treatment jig 9a is directly mounted on the surface of a substrate support portion 4a. However, the generated particles move downward to the shielding plate 9b mounted on a substrate support portion 4b, and the substrate support portion 4b is located immediately below the substrate support portion 4a on which the heat treatment jig 9a is mounted. Therefore, the particles do not move downward further and adhere to the semiconductor silicon substrate 10 placed in a substrate support portion 4c. However, in this case, the number of semiconductor silicon substrates 10 loaded in the heat treatment boat becomes half as compared with the loading method shown in FIGS. 6A, 6B, 7A, and 7B.

Thus, either a usage mode (see FIGS. 6A, 6B, 7A and 7B) in which the heat treatment jig 9a and the shielding plate 9b are integrally used or a usage mode (see FIG. 8) in which the heat treatment jig 9a and the shielding plate 9b are separated from each other can be adopted in the heat treatment jig with a shielding plate.

Figure 9:
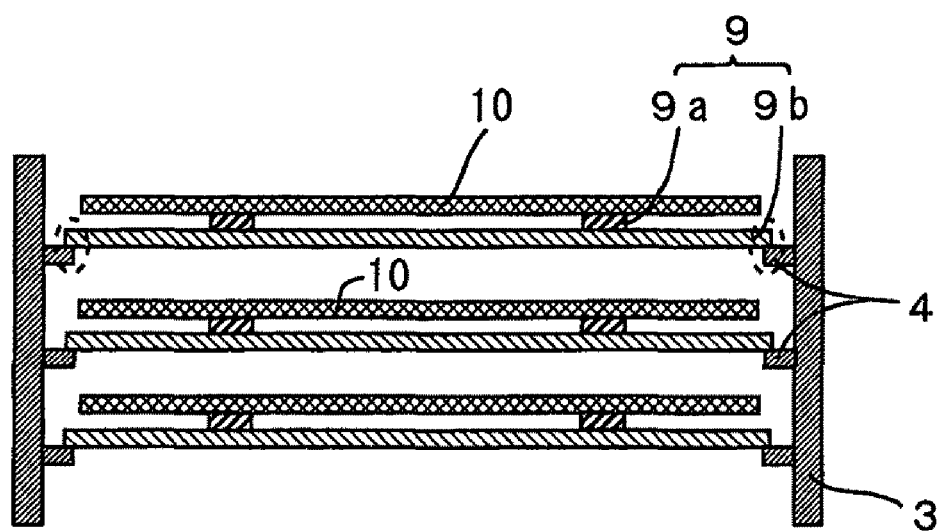
FIG. 9 is a longitudinal cross-sectional view of part of the heat treatment boat, schematically showing a more preferable example of how the heat treatment jig with a shielding plate is set.

FIG. 9 is a longitudinal cross-sectional view of part of the heat treatment boat, schematically showing a more preferable example of how the heat treatment jig with a shielding plate is set. As shown in FIG. 9, the heat treatment jig 9 with a shielding plate is mounted on the substrate support portion 4 of the heat treatment boat, and the heat treatment jig 9 with a shielding plate comprises the cristobalitized heat treatment jig 9a of the ring structure and the shielding plate 9b of the disc structure whose diameter is larger than that of the cristobalitized heat treatment jig 9a.

That is, the loading method of FIG. 9 differs from the loading method of FIGS. 7A and 7B in that the substrate support portion 4 is remarkably shortened and the contact portion (region surrounded by the broken line) between the substrate support portion 4 and the shielding plate 9b is configured to be outwardly away from the surface of the semiconductor silicon substrate 10. Therefore, the particles generated by the contact between the substrate support portion 4 and the shielding plate 9b do not drop on and adhere to the surface of the silicon substrate 10 placed on the substrate support portion 4 immediately below the shielding plate 9b.

Figure 10A:
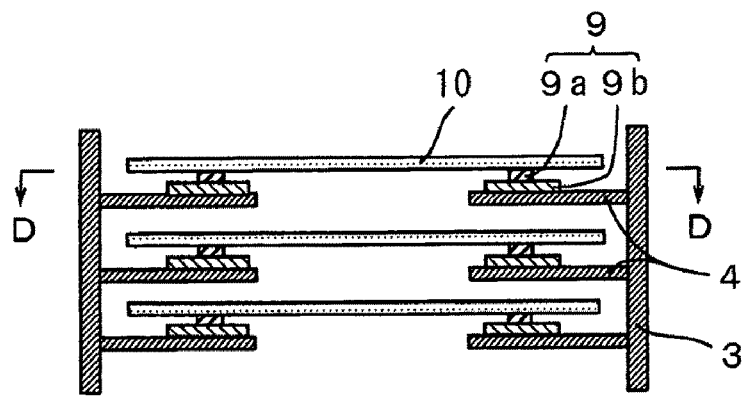
FIG. 10A is a longitudinal cross-sectional view of part of the heat treatment boat, schematically showing another more preferable example of how the heat treatment jig with a shielding plate is set.
Figure 10B:
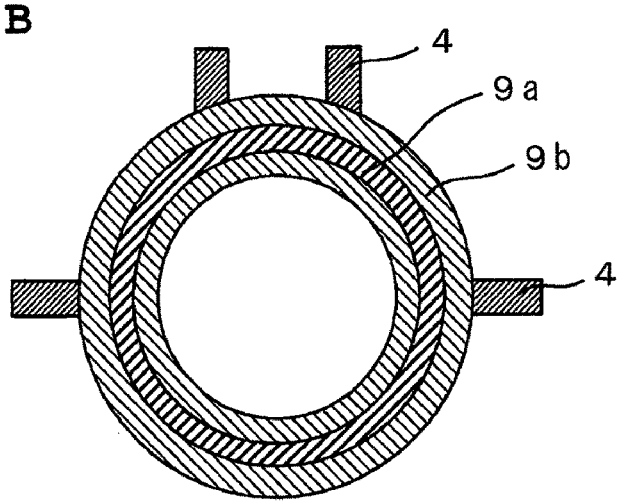
FIG. 10B is a cross-sectional view seen in the direction of arrow D-D of FIG. 10A.
Figure 10C:
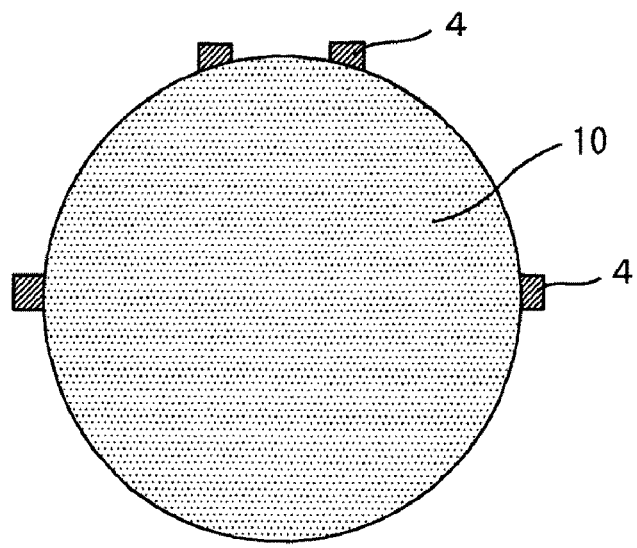
FIG. 10C is a plan view.

FIG. 10A is a longitudinal cross-sectional view of part of the heat treatment boat, schematically showing another more preferable example of how on the heat treatment jig with a shielding plate is set, FIG. 10B is a cross-sectional view seen in the direction of arrow D-D of FIG. 10A, and FIG. 10C is a plan view. In the configuration shown in FIGS. 10A to 10C, the heat treatment jig 9 with a shielding plate is mounted on the substrate support portion 4, and the heat treatment jig 9 with a shielding plate comprises the cristobalitized heat treatment jig 9a of the ring structure type and the shielding plate 9b having the diameter larger than the outer diameter of the cristobalitized heat treatment jig 9a.

The shielding plate 9b used in the configuration of FIG. 9 is of the ring structure type, and the shielding plate 9b has the structure in which the outer diameter is decreased by cutting out and removing an outer periphery to the neighbor of the region where the shielding plate 9b comes into contact with the cristobalitized heat treatment jig 9a. When the shielding plate 9b has the disc structure, or when the outer diameter of the shielding plate 9b is excessively large, radiation light does not efficiently reach the backside of the silicon substrate 10 during the heat treatment, so that the shielding plate 9b is made to be of the ring structure type and its outside diameter is decreased.

The shielding plate having the diameter larger than that of the cristobalitized heat treatment jig is used in the heat treatment jig with a shielding plate. In the case of the cristobalitized heat treatment jig of the disc structure type, preferably a radius of the shielding plate is larger than that of the cristobalitized heat treatment jig by at least 5 mm. When the radius of the shielding plate is larger than that of the cristobalitized heat treatment jig by at least 5 mm, the effect of suppressing the drop and adhesion of the particles onto the semiconductor silicon substrate is significantly exhibited.

In the case of the cristobalitized heat treatment jig of the ring structure type, the shielding plate may be of either the disc structure type or the ring structure type. In the case of the shielding plate of the ring structure type, preferably the shielding plate has a width larger than that of the cristobalitized heat treatment jig (i.e., ring) by at least 5 mm either on the outer diameter side of the shielding plate, or on the inner diameter side of the shielding plate. This is because the particle drop from an edge portion on the outer diameter side of the ring can be suppressed while the particle drop from an edge portion on the inner diameter side is suppressed.

The method for manufacturing the heat treatment jig according to the present invention pertains to a method for manufacturing the above-described cristobalitized heat treatment jig. Because the heat treatment jig with a shielding plate comprises the cristobalitized heat treatment jig and the shielding plate, obviously the heat treatment jig with a shielding plate can be manufactured by the method for manufacturing the heat treatment jig of the present invention.

The features of the method for manufacturing the heat treatment jig of the present invention are: introducing a cristobalitization promoting agent to a surface or in the vicinity of a surface of the heat treatment jig; performing heat treatment at temperatures in the range of 1000 to 1380° C.; and repeating the introduction of the cristobalitization promoting agent and the heat treatment.

As described above, in the case where calcium is used as the cristobalitization promoting agent, usually the cristobalitized oxide film can be formed in the surface of the heat treatment jig by performing the heat treatment at temperatures in the range of 1100 to 1350° C. for the duration time of 10 to 50 hours in the oxidizing atmosphere. However, the surface of the heat treatment jig can completely be cristobalitized by repeating the steps of "introduction of cristobalitization promoting agent" and "heat treatment". Even if the cristobalitization is insufficient because of one campaign consisting of series of steps, the cristobalitization is promoted by repeating the campaign.

The number of repetitions of campaign consisting of the series of steps (treatment campaign) is not particularly limited. The number of repetitions may appropriately be determined according to the type of cristobalitization promoting agent, the method of introducing the cristobalitization promoting agent to the surface or in the vicinity of the surface of the heat treatment jig, and the concentration of the cristobalitization promoting agent in the surface of the heat treatment jig. In the case where the surface of the heat treatment jig is completely cristobalitized by treating in one campaign, it is not necessary to repeat the campaign any more.

As described above, alkali metals, alkali earth metals, aluminum, and transition metals such as tungsten, zirconium, and molybdenum can be used as the cristobalitization promoting agent.

In the method for manufacturing the cristobalitized heat treatment jig of the present invention, the impurities mixed in the heat treatment jig cleaning chemical agent can be utilized as the cristobalitization promoting agent.

Usually hydrofluoric acid, nitric acid, ammonia water, hydro peroxide water, and a mixture solution thereof are used as the jig cleaning chemical agent. Even if the high-purity chemical agent is used, the impurities such as the alkali metals and the alkali earth metals are always contained in the chemical agent. Accordingly, the cristobalitization is promoted by repeating the steps of "chemical cleaning" and "heat treatment", and the surface of the heat treatment jig can completely be cristobalitized.

When part of the oxide film existing in the surface of the heat treatment jig is left over in cleaning the heat treatment jig with hydrofluoric acid as the cleaning chemical agent, the cristobalitized oxide film can be formed more effectively in the surface of the heat treatment jig. There is no limitation for a residual amount (ratio) of oxide film. Even when the trace amount of oxide film is left over, the cristobalitization promotion effect is also exerted.

In the cristobalitization promoting agent introduced to the surface or in the vicinity of the surface of the heat treatment jig in forming the cristobalitized oxide film in the surface of the heat treatment jig, as described above, preferably the concentration is not less than $1 \times 10^{10}$ atoms/cm$^2$ in area equivalent. On the other hand, when the method of repeating the steps of "introduction of cristobalitization promoting agent" and "heat treatment" is adopted, the cristobalitization promotion effect is exerted by the repetition of the treatment campaign consisting of series of steps, so that the cristobalitized oxide film can be formed in the surface of the heat treatment jig even if the concentration of the cristobalitization promoting agent is less than $1 \times 10^{10}$ atoms/cm$^2$ in area equivalent.

EXAMPLES

The following studies were performed in order to confirm the effects of the heat treatment jig for semiconductor silicon substrates of the present invention and the method for manufacturing the same.

Example 1

In order to confirm whether or not cristobalite is generated in the oxide film formed in the surface of the heat treatment jig, the silicon-carbide (SiC) disc-structured jig having the diameter of 319 mm and the thickness of 1.5 mm was mounted in the boat groove of the heat treatment boat of the vertical heat treatment furnace, the silicon ring having the outer diameter of 210 mm, the inner diameter of 190 mm, the flatness of 20 μm, and the surface roughness of 2 μm was dipped in the aqueous solution whose sodium concentration was 20 ppm, the silicon ring was pulled up and naturally dried, and the silicon ring was mounted on the disc-structured jig.

The silicon ring having the same structure was dipped in the potassium aqueous solution, the calcium aqueous solution, the barium aqueous solution, the aluminum aqueous solution, or the magnesium aqueous solution (each concentration is 20 ppm), the silicon ring was pulled up and naturally dried, and the silicon ring was mounted on the disc-structured jig.

On the other hand, for the sake of comparison, the jig (made of silicon carbide) having the same disc structure was mounted on the heat treatment boat, and the silicon ring having the same structure was mounted on the disc-structured jig without performing the process of dipping the silicon ring in the sodium, potassium, or calcium aqueous solution.

After the oxidizing heat treatment was performed at 1320° C. for 15 hours, the heat treatment jig was taken out to observe the silicon ring surface with a microscope. As a result, in the ring dipped in the sodium aqueous solution (contaminated by sodium), it was confirmed that cracks were generated in each position of the oxide film formed in the surface of the ring.

After the heat treatment was further performed five times to the heat treatment jigs on the same conditions, the same observation was performed. It was able to be confirmed that the crack regions were grown in all the contaminated rings (see FIG. 2). On the other hand, in the ring (i.e., no contamination) of the comparative example which was not dipped in the sodium, potassium, or calcium aqueous solution, any crack was not observed in the oxide film (see FIG. 4).

As a result of X-ray diffraction, a peak of cristobalite was observed from the contaminated ring while the peak was not observed from the ring which was not contaminated.

Example 2

In order to study the presence or absence of contamination transfer to the silicon substrate due to the use of the cristobalitization promoting agent, the same disc-structured jig and silicon ring as Example 1 were used, the aqueous solution whose calcium concentration was 0.02 ppm, 0.2 ppm, 2.0 ppm, or 20 ppm was caused to fall in drops on the surface of the silicon ring, and the silicon ring was naturally dried.

Then, as with Example 1, the disc-structured jig was mounted on the heat treatment boat, the naturally dried silicon ring was mounted on the disc-structured jig, the silicon substrate was placed on the silicon ring, and the heat treatment was performed on the same conditions as Example 1. The post-heat treatment silicon substrate was analyzed to study the presence or absence of the contamination transfer from the silicon ring.

In the oxide film formed in the silicon substrate surface, the calcium concentrations in area equivalent of $6.0 \times 10^{10}$ atoms/cm$^2$, $3.7 \times 10^{10}$ atoms/cm$^2$, $1.3 \times 10^{10}$ atoms/cm$^2$, and $1.2 \times 10^{10}$ atoms/cm$^2$ were detected respectively in the descending order of the calcium concentration of the aqueous solution caused to fall in drops on the surface of the ring. In the silicon substrate placed on the ring which was not contaminated, the calcium concentration was less than a detection limit value ($<1.0 \times 10^9$ atoms/cm$^2$).

Then, in the silicon substrates in which the oxide films were removed, when the calcium concentration (contamination amount) was measured at a depth of 1.0 μm from the surface, the contamination amount of calcium was less than the detection limit value ($<1.0 \times 10^9$ atoms/cm$^2$) in each of the silicon substrates.

As is clear from the result, the contamination transfer to the silicon substrate caused by use of the heat treatment jig of the present invention was not found.

Example 3

In order to study the cristobalite generation and the slip generation, the same disc-structured jig and silicon ring as Example 1 were used, the aqueous solutions whose calcium, barium, potassium, aluminum, magnesium, tungsten, zirconium, and molybdenum concentrations were 2.0 ppm and 20 ppm respectively were caused to fall in drops on the surface of the silicon rings, the silicon rings were naturally dried, and the heat treatment was performed at 1000° C. for one hour in the oxidation atmosphere.

Then, as with Example 1, the disc-structured jig was mounted on the heat treatment boat, the naturally-dried and heat-treated silicon ring was mounted on the disc-structured jig, and the heat treatment was performed four times on the same conditions as Example 1. The silicon substrate was placed on the silicon ring, and the fifth heat treatment was performed on the same conditions as Example 1. For the sake of comparison, the heat treatment was similarly performed to the silicon substrate using the ring which was not contaminated.

As a result of the study of the slip generation in the post-heat treatment silicon substrate, the intensive slip was generated in the ring which was not contaminated. On the other hand, the effect of decreasing the number of slips was found in the silicon substrate placed on the silicon ring contaminated by calcium, barium, and the like. The slip decreasing effect became larger in the case of using the ring treated by the 20-ppm aqueous solution having the higher contamination concentration.

Example 4

The heat treatment was further performed five times on the same conditions as Example 1 to the silicon ring used in Example 3 (namely, the calcium, barium, potassium, aluminum, magnesium, tungsten, zirconium, and molybdenum aqueous solutions were caused to fall in drops on the surface of the silicon rings, the silicon rings were naturally dried, and the heat treatment was performed four times on the same conditions as Example 1), the disc-structured jig and the silicon ring were mounted on the heat treatment boat, the silicon substrate was placed thereon, and the heat treatment was performed. Similarly the heat treatment of the silicon substrate was performed in the case where the ring which was not contaminated was used.

As a result of the study of the slip generation in the post-heat treatment silicon substrate, it was found that the slip generation was further decreased in all the silicon substrates placed on the contaminated silicon rings. However, the intensive slip was still generated in the silicon substrate placed on the ring which was not contaminated.

The aqueous solution in which the calcium aqueous solution and the barium aqueous solution were mixed together was caused to fall in drops on the ring surface, the ring was naturally dried, and the heat treatment was performed. Then, the heat treatment was performed eight times on the same conditions as Example 1. The silicon substrate was placed on the ring, and the slip was observed after the heat treatment. The slip decreasing effect was also found to an extent similar to the above Examples.

Example 5

In order to study the cristobalite generation and the slip generation, the silicon-carbide ring having the outer diameter of 230 mm and the inner diameter of 190 mm was used, the ring was dipped in the aqueous solution whose sodium concentration was 30 ppm, and the ring was pulled up and naturally dried to make the contaminated ring. Then, high-temperature oxidizing heat treatment was performed four times at 1300° C. for 24 hours to the contaminated ring and the non-contaminated ring prepared without performing the process of dipping the ring in the sodium aqueous solution, and thereby the oxide film was grown in the silicon carbide surface.

The rings were mounted on the heat treatment boat, the silicon substrates were placed on the rings, and the heat treatment was performed on the same conditions as Example 1.

As a result of the study of the slip generation in the post-heat treatment silicon substrate, the plural intensive slips were generated at a position corresponding to the inner peripheral portion of the ring in the silicon substrate placed on the non-contaminated ring. On the other hand, in the silicon substrate placed on the contaminated ring, it was found that the number of slips is largely decreased compared with the silicon substrate placed on the non-contaminated ring.

When the silicon carbide surface of the ring was observed with the optical microscope after the heat treatment, it was found that the cracks were generated in the oxide film formed in the surface of the contaminated ring.

Example 6

In order to confirm whether or not the impurities mixed in the heat treatment jig cleaning chemical agent can be utilized as the cristobalitization promoting agent, the silicon substrate having the diameter of 200 mm was dipped for ten minutes in a heat treatment jig cleaning tank in which hydrofluoric acid having the concentration of 5% was poured, the silicon substrate was naturally dried after washing for 60 minutes with pure water, and the metallic adhesion substance on the surface of the silicon substrate was evaluated by the atomic absorption analysis.

As a result, it was found that the concentration of calcium acting as the cristobalitization promoting agent on the silicon substrate surface was $5.5 \times 10^{10}$ atoms/cm$^2$ in area equivalent and the concentration of sodium was not more than $1 \times 10^9$ atoms/cm$^2$ in area equivalent.

Example 7

In order to confirm effectiveness of the method for manufacturing the heat treatment jig of the present invention, as with Example 6, the silicon heat treatment jig (ring structure type) having the outer diameter of 210 mm and the inner diameter of 190 mm was dipped in hydrofluoric acid, the silicon heat treatment jig was naturally dried after washing with pure water, and the heat treatment was performed at 1350° C. for 20 hours in the oxidizing atmosphere. Then, the surface of the silicon heat treatment jig was observed with the optical microscope. The steps of "chemical cleaning" and "heat treatment" were repeated, and the surface was observed in each case.

As a result, it was not able to confirm that a cristobalite nucleus was formed in the jig surface after one treatment campaign consisting of "chemical cleaning" and "heat treatment". However, from the second treatment campaign, it was able to confirm that the many cristobalite nuclei were formed and the cristobalite film (cristobalitized oxide film) was partially formed. When the surface of the heat treatment jig to which the campaigns were repeated eight times was observed with the microscope, the silicon ring oxide film surface was completely covered with the cristobalitized film.

On the other hand, for the sake of comparison, the same silicon heat treatment jig (ring structure type) was dipped in the calcium aqueous solution such that the calcium concentration became $5\times10^{10}$ atoms/cm$^2$ in area equivalent, the silicon heat treatment jig was naturally dried, and the heat treatment was performed on the same conditions (at 1350° C. for 20 hours in the oxidizing atmosphere). Then, the jig surface was observed with the microscope. Then, only the heat treatment was repeated, and the surface was observed in each case.

As a result, the cristobalite nucleus was able to be found in part of the oxide film formed in the jig surface after the third heat treatment, and the cristobalite film was widely formed after the eighth heat treatment. However, when compared with the method of repeating the treatment campaign consisting of "chemical cleaning" and "heat treatment", the small cristobalitization promotion effect was obtained, and the whole jig surface was not able to be covered with the cristobalite film by repeating the heat treatment merely.

The steps of "introduction of cristobalitization promoting agent" and "heat treatment" were repeated to the silicon heat treatment jig (ring structure type) in which calcium was caused to adhere to the surface. When the surface was observed in each case, the substantially same result as that of the repetition of "chemical cleaning" and "heat treatment" was obtained.

Then, the heat treatment jig to which "chemical cleaning" and "heat treatment" were performed ten times and the heat treatment jig to which only the heat treatment was performed ten times for the sake of comparison were inserted in the boat groove of the heat treatment boat of the vertical heat treatment furnace, the silicon substrates having the diameters of 300 mm were placed on the heat treatment jigs respectively, and the heat treatment (hereinafter simply referred to as "SIMOX heat treatment") which is performed in a SIMOX production process was performed.

As a result, in the case of using the heat treatment jig to which only the heat treatment was performed, the slip was generated from the contact portion with the jig in the silicon substrate. On the contrary, no slip was generated in the case of using the heat treatment jig to which "chemical cleaning" and "heat treatment" were performed.

Example 8

In order to confirm the effect of suppressing the particle adhesion to the silicon substrate surface by use of the heat treatment jig with a shielding plate, the silicon-carbide shielding plate having the diameter of 220 mm, 250 mm, or 300 mm was inserted in the boat groove of the heat treatment boat of the vertical heat treatment furnace, the silicon ring (cristobalitized heat treatment jig) having the outer diameter of 210 mm and the inner diameter of 190 mm was mounted on the shielding plate, the silicon substrate having the diameter of 300 mm was placed on the silicon ring, and the SIMOX heat treatment was performed. Then, the particles adhering to the silicon substrate surface were measured. For the sake of comparison, the silicon ring was directly attached without inserting the shielding plate in the boat groove, the silicon substrate was placed on the silicon ring, and the same measurement was performed.

As a result, in the case where the shielding plate was not inserted, 340 particles each having the diameter of at least 0.3 μm exist in the silicon substrate surface. On the other hand, the number of adhesion particles was 73 in the case where the shielding plate having the diameter of 220 mm was inserted, and the number of adhesion particles ranged from 30 to 50 in the case where the shielding plate having the diameter of 250 mm or 300 mm was inserted.

As shown in FIG. 9, the heat treatment jig was mounted on the substrate support portion 4 while the contact portion between the substrate support portion 4 and the shielding plate 9b was configured to be outwardly away from the surface of the semiconductor silicon substrate 10. When the same study was performed, the number of adhesion particles was not more than 30 in the silicon substrate surface.

As described above, the heat treatment jig for semiconductor silicon substrates of the present invention is the jig in which the cristobalitized oxide film is formed in the region functioning to support the semiconductor silicon substrate while contacting with the backside thereof. When this heat treatment jig is used, the generation of the slip can be prevented. When the heat treatment jig is used in combination with the shielding plate, the particle adhesion to the silicon substrate surface is further suppressed, the device quality characteristics is maintained at the higher level, and the device production yield can substantially be improved. The heat treatment jig can easily be manufactured by the method for manufacturing the heat treatment jig of the present invention.

Accordingly, the heat treatment jig for silicon substrates of the present invention and the method for manufacturing the same can suitably be utilized in producing the silicon single crystal.

What is claimed is:

1. A heat treatment jig for semiconductor silicon substrates which is mounted on a heat treatment boat in a vertical heat treatment furnace to support a semiconductor silicon substrate while contacting therewith, wherein a surface of the heat treatment jig made of silicon functioning to support said semiconductor silicon substrates while contacting therewith includes a cristobalitized oxide film with cracks.

2. The heat treatment jig for semiconductor silicon substrates according to claim 1, wherein the cristobalitized oxide film is obtained by performing heat treatment after a cristobalitization promoting agent is introduced to the heat treatment jig or to a surface or in the vicinity of a surface of the heat treatment jig to which an oxidation treatment is performed beforehand.

3. The heat treatment jig for semiconductor silicon substrates according to claim 2, wherein the cristobalitization promoting agent is an alkali metal, an alkali earth metal, aluminum, or a transition metal.

4. The heat treatment jig for semiconductor silicon substrates according to claim 3, wherein a concentration of the cristobalitization promoting agent introduced to the surface or in the vicinity of the surface of the heat treatment jig is not less than $1\times10^{10}$ atoms/cm$^2$ in area equivalent.

5. A method for manufacturing the heat treatment jig for semiconductor silicon substrates in claim 4, comprising the steps of:
    introducing a cristobalitization promoting agent to a surface or in the vicinity of a surface of the heat treatment jig;
    performing heat treatment at temperatures in the range of 1000 to 1380° C.; and
    repeating the introduction of the cristobalitization promoting agent and the heat treatment.

6. The method for manufacturing the heat treatment jig for semiconductor silicon substrates according to claim 5, wherein impurities mixed in a heat treatment jig cleaning chemical are utilized as the cristobalitization promoting agent.

7. The method for manufacturing the heat treatment jig for semiconductor silicon substrates according to claim 6, wherein part of the oxide film existing in the surface of the heat treatment jig is left over when the heat treatment jig is cleaned while hydrofluoric acid is used as the heat treatment jig cleaning chemical.

8. A method for manufacturing the heat treatment jig for semiconductor silicon substrates in claim 3, comprising the steps of:
introducing a cristobalitization promoting agent to a surface or in the vicinity of a surface of the heat treatment jig;
performing heat treatment at temperatures in the range of 1000 to 1380° C.; and
repeating the introduction of the cristobalitization promoting agent and the heat treatment.

9. The method for manufacturing the heat treatment jig for semiconductor silicon substrates according to claim 8, wherein impurities mixed in a heat treatment jig cleaning chemical are utilized as the cristobalitization promoting agent.

10. The method for manufacturing the heat treatment jig for semiconductor silicon substrates according to claim 9, wherein part of the oxide film existing in the surface of the heat treatment jig is left over when the heat treatment jig is cleaned while hydrofluoric acid is used as the heat treatment jig cleaning chemical agent.

11. The heat treatment jig for semiconductor silicon substrates according to claim 2, wherein a concentration of the cristobalitization promoting agent introduced to the surface or in the vicinity of the surface of the heat treatment jig is not less than $1 \times 10^{10}$ atoms/cm$^2$ in area equivalent.

12. A method for manufacturing the heat treatment jig for semiconductor silicon substrates in claim 2, comprising the steps of:
introducing a cristobalitization promoting agent to a surface or in the vicinity of a surface of the heat treatment jig;
performing heat treatment at temperatures in the range of 1000 to 1380° C.; and
repeating the introduction of the cristobalitization promoting agent and the heat treatment.

13. The method for manufacturing the heat treatment jig for semiconductor silicon substrates according to claim 12, wherein impurities mixed in a heat treatment jig cleaning chemical agent are utilized as the cristobalitization promoting agent.

14. The method for manufacturing the heat treatment jig for semiconductor silicon substrates according to claim 13, wherein part of the oxide film existing in the surface of the heat treatment jig is left over when the heat treatment jig is cleaned while hydrofluoric acid is used as the heat treatment jig cleaning chemical.

15. The heat treatment jig for semiconductor silicon substrates according to claim 1, wherein the cristobalitization promoting agent is an alkali metal, an alkali earth metal, aluminum, or a transition metal.

16. The heat treatment jig for semiconductor silicon substrates according to claim 15, wherein a concentration of the cristobalitization promoting agent introduced to the surface or in the vicinity of the surface of the heat treatment jig is not less than $1 \times 10^{10}$ atoms/cm$^2$ in area equivalent.

17. A heat treatment jig for semiconductor silicon substrates, comprising:
a heat treatment jig as in claim 1; and
a shielding plate which prevents particles from adhering to a semiconductor silicon substrate, the shielding plate having a diameter larger than that of the heat treatment jig, the particles being generated due to the cristobalitized oxide film.

18. A method for manufacturing the heat treatment jig for semiconductor silicon substrates in claim 1, comprising the steps of:
introducing a cristobalitization promoting agent to a surface or in the vicinity of a surface of the heat treatment jig;
performing heat treatment at temperatures in the range of 1000 to 1380° C.; and
repeating the introduction of the cristobalitization promoting agent and the heat treatment.

19. The method for manufacturing the heat treatment jig for semiconductor silicon substrates according to claim 18, wherein impurities mixed in a heat treatment jig cleaning chemical agent are utilized as the cristobalitization promoting agent.

20. The method for manufacturing the heat treatment jig for semiconductor silicon substrates according to claim 19, wherein part of the oxide film existing in the surface of the heat treatment jig is left over when the heat treatment jig is cleaned while hydrofluoric acid is used as the heat treatment jig cleaning chemical agent.

* * * * *

UNITED STATES PATENT AND TRADEMARK OFFICE
CERTIFICATE OF CORRECTION

PATENT NO.        : 8,105,078 B2                                          Page 1 of 1
APPLICATION NO.   : 11/702591
DATED             : January 31, 2012
INVENTOR(S)       : Adachi It is certified that error appears in the above-identified patent and that said Letters Patent is hereby corrected as shown below:

Title Page, Item (30)
Foreign Application Priority Data
"2006-030348" should read:
"2006-030438"

Signed and Sealed this
Fourteenth Day of August, 2012

David J. Kappos
*Director of the United States Patent and Trademark Office*